United States Patent [19]

Nakabayashi et al.

[11] Patent Number: 4,950,992

[45] Date of Patent: Aug. 21, 1990

[54] MAGNETIC RESONANCE IMAGING SYSTEM AND METHOD

[75] Inventors: Kazuto Nakabayashi; Masatoshi Hanawa, both of Ootawara, Japan

[73] Assignee: Kabushiki Kaisha Toshiba, Kawasaki, Japan

[21] Appl. No.: 354,762

[22] Filed: May 22, 1989

[30] Foreign Application Priority Data

May 24, 1988 [JP] Japan .............................. 63-126513

[51] Int. Cl.$^5$ ............................................. G01R 33/20
[52] U.S. Cl. ..................................... 324/309; 324/307
[58] Field of Search ............... 324/300, 307, 309, 311, 324/312, 313; 128/653

[56] References Cited

U.S. PATENT DOCUMENTS

| | | | |
|---|---|---|---|
| 4,628,262 | 12/1986 | Maudsley | 324/309 |
| 4,739,266 | 4/1988 | Kunz | 324/309 |
| 4,818,941 | 4/1989 | Mckinnon | 324/309 |

Primary Examiner—Michael J. Tokar
Attorney, Agent, or Firm—Foley & Lardner, Schwartz, Jeffery, Schwaab, Mack, Blumenthal & Evans

[57] ABSTRACT

A magnetic resonance imaging system includes a static field generating section, a gradient field applying section, high-frequency pulse applying section, a sequence control section, a receiving section and an imaging processing section. The sequence control section generates a 180° pulse at a timing at which a center of the 180° pulse appears at time $t = TE'/2$ when a center of a 90° pulse appears at time $t = 0$ under the condition $TE' = TE - N\tau c$ (where TE is an echo time with respect to a proton, $\tau c$ is a period in which phases of spins of the proton and fat match with each other and which is obtained on the basis of a chemical shift of protons of water and the fat, and n is an integer not less than 1), and generates a read gradient field Gr such that its intensity is set to allow an echo peak to appear at time $t = TE = TE' + n\tau c$.

6 Claims, 3 Drawing Sheets

MAGNETIC RESONANCE IMAGING SYSTEM AND METHOD

BACKGROUND OF THE INVENTION

1. Field of the Invention

The present invention relates to a magnetic resonance imaging (MRI) system and method for exciting magnetic resonance in a specific portion of an object to be examined, which is placed in a static magnetic field, by applying a gradient magnetic field and high-frequency pulses (RF pulse) of a 90° pulse-180° pulse sequence to the object, acquiring spin echo signals induced by the magnetic resonance, and imaging the specific portion by using the spin echo signal data in accordance with a predetermined image reconstruction method.

2. Description of the Related Art

In a general medical MRI system, a gradient magnetic field and a high-frequency pulse are applied to an object to be examined, which is placed in a static magnetic field, in accordance with a predetermined sequence for magnetic resonance (MR) excitation/magnetic resonance (MR) data acquisition. As a result, an MR phenomenon occurs in a specific portion of the object. An MR signal induced by the MR phenomenon is detected. When acquired MR data is subjected to imaging data processing including image reconstruction, the anatomical data or quality data of the specific portion of the object is imaged.

A conventional MRI system of this type generally comprises a static field generator, X-, Y-, and Z-axis gradient field generators, and high-frequency transmitter and receiver. When the X-, Y-, and Z-axis gradient field generators and the high-frequency transmitter are driven in accordance with a predetermined sequence, X-, Y-, and Z-axis gradient fields Gx, Gy, and Gz, and a high-frequency pulse are generated. As a result, MR is excited and an MR signal is generated. The MR signal is received by the receiver. The reception data is then subjected to predetermined image processing including image reconstruction. The tomographic image of a certain slice portion of an object to be examined is generated in this manner, and is displayed on a monitor.

In an excitation sequence of MR, the X-, Y-, and Z-axis gradient fields Gx, Gy, and Gz are respectively used as, e.g., a read gradient field Gr, an encoding gradient field Ge, and a slicing gradient field Gs.

As a conventional MR imaging method often used in such a system, an imaging method based on a spin echo sequence using high-frequency pulses of 90° pulse-180° pulse sequence is known.

Such a conventional spin echo sequence will be described with reference to FIG. 1.

In the spin echo sequence, in order to minimize influences due to inhomogeneity of a static field, the relationship between time $t=0$ when a 90° pulse is applied, time $t=T180$ when a 180° pulse is applied, and time $t=TE$ when the peak of a spin echo signal appears must satisfy the following condition:

$$T180 = TE/2$$

In this case, the earliest time when echo signals can be acquired comes after application of a 180° pulse having a pulse width Tw. In addition, this start time comes at a point A in FIG. 1, i.e., time at which the leading edge of the reading gradient field Gr is stabilized at the end of the trailing edge of the slicing gradient field Gs. Moreover, when data acquisition is performed in a symmetrical manner with respect the echo peak at time $t=TE$, an echo signal acquisition time Taq is limited to the following condition:

$$TE - Tw - 2\alpha \geq Taq$$

where $\alpha$ is the fall time of the slicing gradient field Gs and of the rise time of the read gradient field Gr. If the resolution is kept unchanged, the upper limit of the time Taq is determined by TE, Tw, and $\alpha$, and moreover, the intensity of a gradient field cannot be satisfactorily decreased. Since $$\text{Noise} \ \alpha \ 1/\sqrt{Taq}$$

the signal-to-noise ratio (S/N) cannot be satisfactorily increased.

As described above, in the conventional system, a 180° pulse is applied while a time ½ the echo time TE (a time interval between the peak of a 90° pulse and that of an echo signal) is set to be T180, i.e., $$TE/2 = T180$$

For this reason, the upper limit of the echo signal acquisition time Taq is limited by $TE - Tw - 2\alpha \geq Taq$, and an increase in S/N is limited when the resolution and the TE time are kept unchanged.

Recently, however, with an improvement in technique for obtaining a homogeneous static field in an MRI system, inhomogeneity of a static field can be reduced to such a degree that no problem is posed in practical applications.

SUMMARY OF THE INVENTION

It is an object of the present invention to provide an MRI system and method which can increase the S/N with respect to the resolution and the echo time TE.

According to the present invention, there is provided a magnetic resonance imaging system comprising a static magnetic field generating section for generating a sufficiently homogeneous static magnetic field in a predetermined imaging volume, a gradient magnetic field applying section for applying a gradient field to the imaging volume, a high-frequency pulse applying section for applying high-frequency pulses to the imaging volume, a sequence control section for controlling the gradient magnetic field and high-frequency pulse applying sections in accordance with a predetermined sequence using high-frequency pulses of a 90° pulse-180° pulse sequence so as to cause a magnetic resonance phenomenon in the imaging volume, a receiving section for receiving a magnetic resonance signal generated in the imaging volume by the magnetic resonance phenomenon, and an imaging processing section for performing predetermined processing, including image reconstruction processing, of the magnetic resonance signal so as to obtain a magnetic resonance image. The sequence control section generates a 180° pulse at a timing at which a center of the 180° pulse appears at time $t=TE'/2$ when a center of a 90° pulse appears at time $t=0$ under the condition $TE'=TE-n\tau c$ (where TE is an echo time with respect to a proton, $\tau c$ is a period in which phases of spins of the proton and fat match with each other and which is obtained on the basis of a chemical shift of protons of water and the fat, and n is an integer not less than 1), and generates the read gradient field Gr such that its intensity is set to allow an echo peak to appear at time t=TE=-TE'+nτc.

According to the MRI system of the present invention, the following advantages can be obtained:

(a) Since Taq' can be set over the limitation of TE−Tw−2α≧Taq, the echo signal acquisition time can be prolonged. Therefore, the S/N can be increased when the resolution and the TE time are kept unchanged.

(b) Although frequency deviation in spins occurs with respect to, e.g., protons because of chemical shift, the phases of the spins match with each other at the time when an echo peak is detected.

(c) If the echo time TE is kept unchanged, the same contrast as in the conventional system can be obtained.

(d) If frequency shift is caused by a factor other than chemical shift, the phases of the spins do not match with each other at the time of an echo peak. Therefore, the same characteristics of echo signals obtained upon execution of a field echo method appear in a portion of the object, in which magnetic susceptibility locally varies. As a result, the portion (e.g., nucleus ruber) in which magnetic susceptibility locally varies can be expressed with a higher contrast than by a normal spin echo method.

According to the MRI system of the present invention, therefore, the S/N with respect to the resolution and the echo time TE can be increased.

DETAILED DESCRIPTION OF THE PREFERRED EMBODIMENTS

Figure 1:
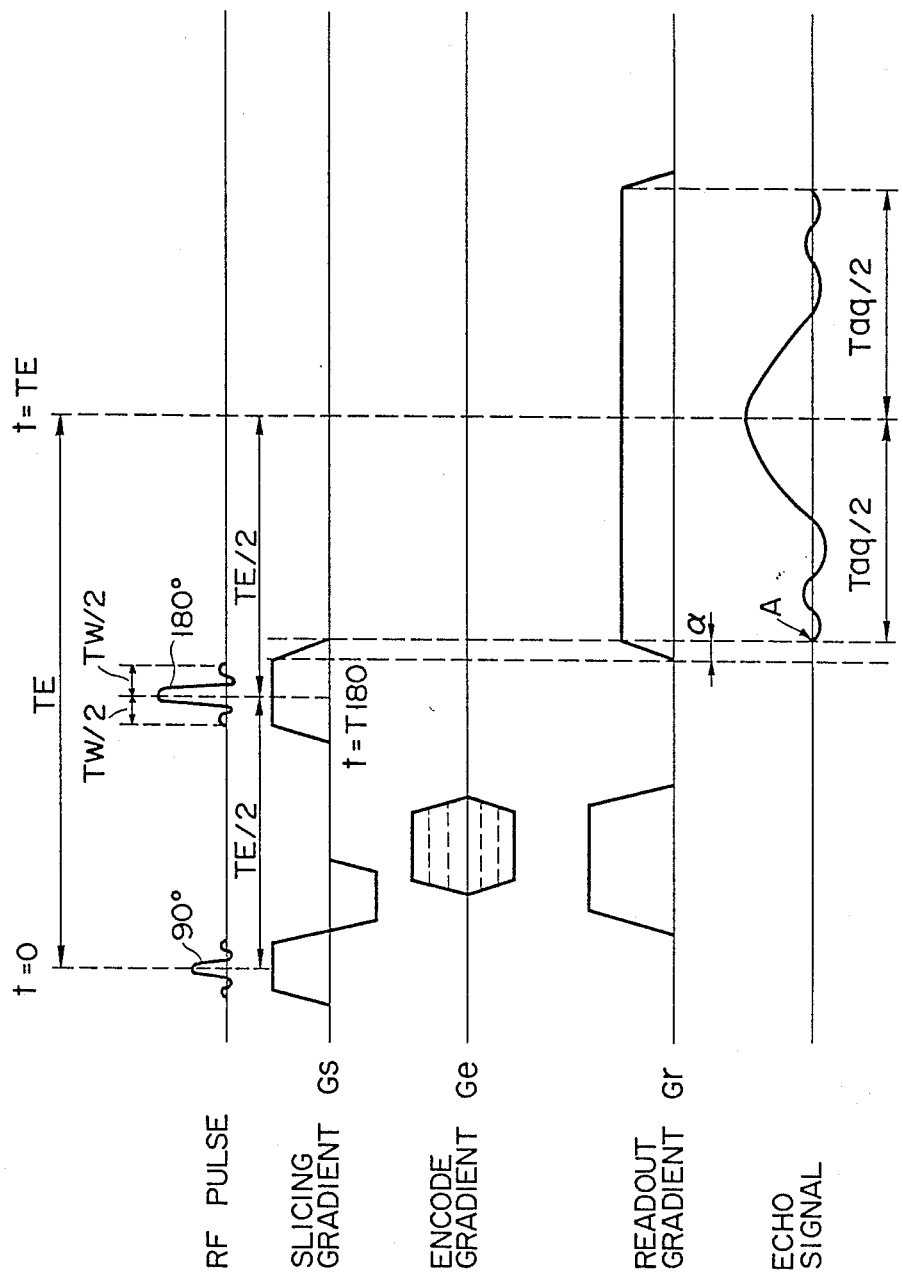
FIG. 1 is a timing chart showing a pulse sequence in a conventional MRI system.
Figure 2:
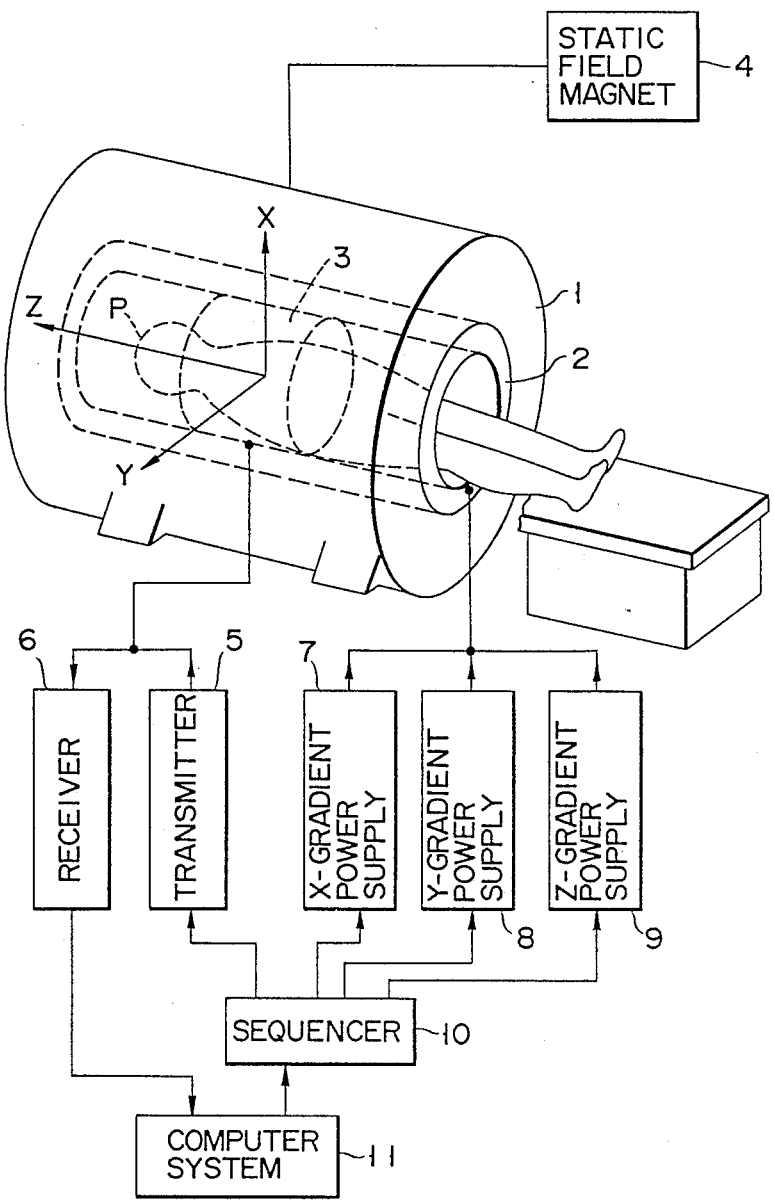
FIG. 2 is a block diagram showing an arrangement of an MRI system according to an embodiment of the present invention.

An arrangement of an MRI system according to an embodiment of the present invention will be described below with reference to FIG. 2.

A static field magnet 1, X-, Y-, and Z-axis gradient coils 2, and a transmission/reception coil 3 are arranged in a gantry 20. The static field magnet 1 serving as a static field generator is constituted by, e.g., a superconductive or normal conductive coil. The X-, Y-, and Z-axis gradient field coils 2 generate X-, Y-, and Z-axis gradient fields Gx, Gy, and Gz. The transmission/reception coil 3 is used to generate a high-frequency pulse and detect an MR signal generated by MR. An object P to be examined is inserted in an imaging volume (a spherical volume in which an imaging magnetic field is formed and only in which diagnosis can be performed; the diameter of the spherical volume being abbreviated as DSV) in the gantry 20.

The static field magnet 1 is driven by a static field magnet controller 4. The transmission/reception coil 3 is driven by a transmitter 5 at the time of excitation and is driven by a receiver 6 at the time of detection of an MR signal. The X-, Y-, and Z-axis gradient field coils 2 are respectively driven by X-, Y-, and Z-gradient power supplies 7, 8, and 9.

The power supplies 7, 8, and 9 and the transmitter 5 are driven by a sequencer 10 in accordance with a predetermined sequence to respectively generate the X-, Y-, and Z-axis gradient fields Gx, Gy, and Gz and a high-frequency pulse of a 90° pulse-180° pulse sequence in accordance with a predetermined pulse sequence pattern to be described later. In this case, the X-, Y-, and Z-axis gradient fields Gx, Gy, and Gz are respectively used as, e.g., a read gradient field Gr, an encoding gradient field Ge, and a slicing gradient field Gs. A computer system 11 controls a sequencer 10. In addition, the computer system 11 generates the tomographic image of a predetermined slice portion of the object and displays it on a display monitor by extracting spin echo signals as MR signals received by the receiver 6 and performing predetermined signal processing.

Figure 3:
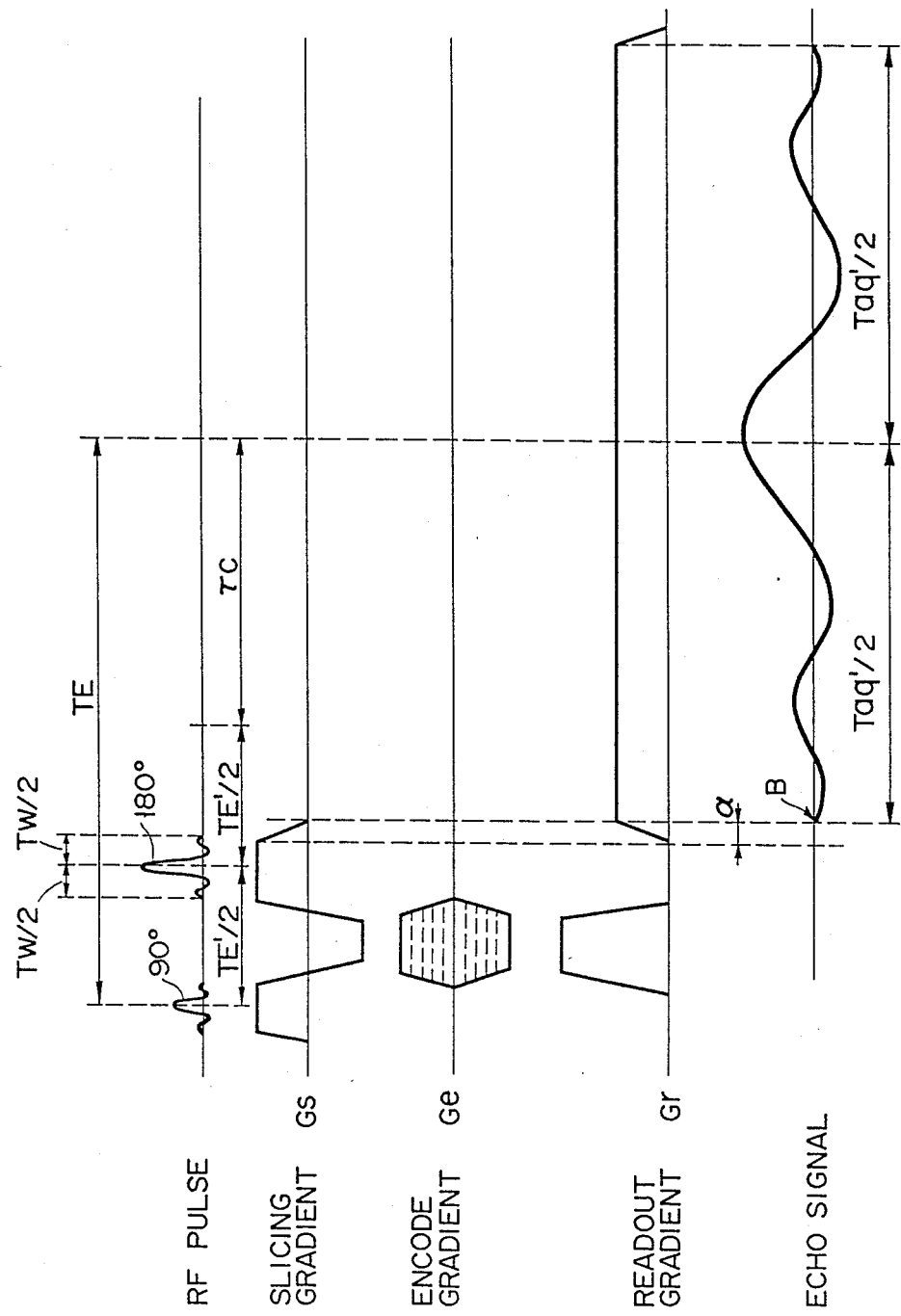
FIG. 3 is a timing chart showing a pulse sequence in the system in FIG. 2.

A pulse sequence for MR excitation/MR data acquisition in the above-described MRI system according to the embodiment of the present invention will be described below with reference to FIG. 3 showing a sequence corresponding to one encoding step.

This sequence is based on a spin echo sequence for applying high-frequency pulses of a 90° pulse-180° pulse sequence, and is arranged on the basis of an echo time TE of the spin echo sequence as follows:

(1) The resonant frequency of a proton (hydrogen atomic nucleus) (included in water) of water with respect to a static field generated by the system is obtained.

(2) The chemical shift amount of the proton of water and a proton (included in fat) of fat is normally 3.3 to 3.6 ppm with respect to the resonant frequency. A time (period) τc during which the phases of spins of the water and the fat match with each other is obtained from the above values as follows:

τc (sec)=1/[(resonant frequency (Hz))×(water chemical shift amount (ppm) of water and fat)]

(3) In association with the predetermined echo time TE of the above spin echo, a time corresponding to TE−τc is set to be a time TE'.

(4) Timings of high-frequency 90° and 180° pulses are determined so as to allow time t=0 and t=TE'/2 to respectively coincide with the centers of the pulses.

(5) Data acquisition can be started, at the earliest timing, from point B in FIG. 3 immediately after the end of the 180° pulse. For example, when data acquisition is to be performed in a symmetrical manner with respect to the peak (time t=TE) of an echo signal, data can be acquired during a period Taq'.

(6) The slicing, read, and phase encoding gradient fields Gs, Gr, and Ge can be basically controlled in the same manner as in a normal spin echo sequence. However, the echo peak of the read gradient field Gr appears at t=TE'+τc, i.e., t=TE instead of t=TE', and its intensity is set to obtain a desired resolution Δl with respect to the period Taq'. In this case, the resolution Δl is given as Δl=1/[Taq'×(intensity of Gr in period Taq')]. The timing at which the echo peak appears is determined by the relationship between the integral values of the read gradient field Gr before application of the 180° pulse (between the 90° pulse and the 180° pulse) and after application of the 180° pulse. Therefore, the intensity of the read gradient field Gr in the period Taq' is determined to satisfy the resolution Δl. In accordance with the determined intensity, the intensity of the read gradient field Gr before application of the 180° pulse is determined to allow the echo peak to appear at t=TE.

Since the pulse sequence of this embodiment is susceptible to the influences of inhomogeneity of a static magnetic field unlike the normal spin echo pulse sequence, an MRI system must be constituted by using a static field magnet system capable of obtaining a highly homogeneous static magnetic field. For example, with a static magnetic field intensity of 0.5 T, inhomogeneity in a volume having DSV=250 mm is preferably set to several ppm or less.

As has been described in detail above, according to the pulse sequence of the present invention, under the above condition, i.e., $\tau c$ (sec)=1/[(resonant frequency (Hz))×(water chemical shift amount (ppm) of water and fat)], an image having the same contrast as that of an image obtained by the system using the conventional method can be obtained. If the resolution of an image is constant, noise of the image is reduced by a value corresponding to $1/\sqrt{(Taq'/Taq)}$. As a result, the S/N ratio is increased.

The present invention is not limited to the above-described embodiment. Various changes and modifications can be made within the spirit and scope of the invention.

What is claimed is:

1. A magnetic resonance imaging system, comprising:
   static magnetic field generating means for generating a homogeneous static magnetic field in a predetermined imaging volume in which an object to be examined is placed;
   gradient magnetic field applying means for applying a gradient magnetic field to the predetermined imaging volume;
   high-frequency pulse applying means for applying high-frequency pulses to the predetermined imaging volume;
   sequence control means for controlling said gradient magnetic field and high-frequency pulse applying means in accordance with a predetermined sequence so as to cause said gradient magnetic field and said high-frequency pulse applying means to respectively apply a predetermined gradient magnetic field and the high-frequency pulses of a 90° pulse-180° pulse sequence, thereby causing a magnetic resonance phenomenon in the predetermined imaging volume;
   receiving means for receiving a magnetic resonance signal generated in the predetermined imaging volume by the magnetic resonance phenomenon; and
   imaging processing means for performing predetermined processing, including image reconstruction processing, of the magnetic resonance signal received by said receiving means so as to obtain a magnetic resonance image;
   said sequence control means including means for generating a 180° pulse at a timing at which a center of the 180° pulse appears at time $t=TE'/2$ when a center of a 90° pulse appears at time $t=0$ under a condition $TE'=TE-n\tau c$ (where TE is an echo time with respect to protons of water, $\tau c$ is a period in which phases of spins of the protons of water and fat match with each other and which is obtained on a basis of a chemical shift of the protons of water and fat, and n is an integer not less than 1), and means for generating a read gradient field such that an intensity thereof is set to allow an echo peak to appear at time $t=TE=TE'+n\tau c$.

2. A system according to claim 1, wherein said sequence control means sets an echo signal acquisition time Taq' to satisfy $Taq'<TE-Tw-2\alpha$ (where Tw is a time width of the 180° pulse and $\alpha$ is a rise or fall time of a gradient magnetic field).

3. A system according to claim 1, wherein n=1.

4. A magnetic resonance imaging method of causing a magnetic resonance phenomenon in a predetermined imaging volume in a homogeneous static magnetic field in which an object to be examined is placed by applying a predetermined gradient magnetic field and high-frequency pulses of a sequence of a 90° pulse and a 180° pulse pair to the predetermined imaging volume, receiving a magnetic resonance signal generated by the magnetic resonance phenomenon, and obtaining a magnetic resonance image by performing predetermined processing, including image construction processing, of the magnetic resonance signal, wherein
   when the high-frequency pulses of sequence of a 90° pulse and a 180° pulse pair and the predetermined gradient magnetic field are respectively applied to the predetermined imaging volume,
   a center of the 180° pulse is set to appear at time $t=TE'/2$ when a center of the 90° pulse appears at time $t=0$ under a condition $TE'=TE-n\tau c$ (where TE is an echo time with respect to protons of water, $\tau c$ is a period in which phases of spins of the protons of water and fat match with each other and which is obtained on a basis of a chemical shift of the protons of water and fat, and n is an integer not less than 1), and an intensity of a read gradient field Gr is set to allow an echo peak to appear at time $t=TE=TE'+n\tau c$.

5. A method according to claim 4, wherein an echo signal acquisition time Taq' is set to satisfy $Taq'<TE-Tw-2\alpha$ (where Tw is a time width of the 180° pulse and $\alpha$ is a rise or fall time of a gradient magnetic field).

6. A method according to claim 4, wherein n=1.

* * * * *